Aug. 12, 1958 L. R. JACOBSEN 2,847,567

AUTOMATIC FREQUENCY CONTROL CIRCUIT

Filed June 10, 1955 2 Sheets-Sheet 1

LANCE R. JACOBSEN
*INVENTOR.*

BY [signature]

HIS ATTORNEY

Aug. 12, 1958 L. R. JACOBSEN 2,847,567

AUTOMATIC FREQUENCY CONTROL CIRCUIT

Filed June 10, 1955 2 Sheets-Sheet 2

LANCE R. JACOBSEN
*INVENTOR.*

BY [signature]

HIS ATTORNEY

United States Patent Office 2,847,567

Patented Aug. 12, 1958

2,847,567

AUTOMATIC FREQUENCY CONTROL CIRCUIT

Lance R. Jacobsen, Lynwood, Calif., assignor to Hoffman Electronics Corporation, a corporation of California Application June 10, 1955, Serial No. 514,436

6 Claims. (Cl. 250—27)

This invention is related to automatic frequency control circuits and, more particularly, to an improved automatic frequency control circuit capable of maintaining the frequency of an associated oscillator at that frequency exhibited by the oscillator just prior to fade-out of an incoming signal.

In the past, carrier fade-out has presented difficulty in permitting automatic frequency control circuits to operate at maximum effectiveness. It is known that carrier fade-out reaches serious proportions on some frequencies at a distance of from 50 to 100 miles from the carrier transmitter, owing to the fact that in this region the ground and sky waves have approximately equal intensity by which fact the probability of phase inversion cancellation is greatly increased. Selective carrier fading is also experienced, unfortunately, at distances greater than 100 miles from the signal transmitter, by reason of the fact that two or more sky waves in following different paths in traveling to the receiver may interfere completely with each other. It is known in FM reception, for example, that carrier fade-out will probably not be accompanied by simultaneous fade-out of the side bands, so that if the FM receiver employs an automatic frequency control system, it will be highly desirable for the local oscillator to maintain its operating frequency at that point at which the fade-out occurs, until of course the carrier reappears to control the AFC system. For a number of years, improved automatic frequency control systems have employed a small electric motor to stabilize the frequency of the local oscillator during carrier fade-out by means of maintaining the reactance of the oscillator circuit at that point which was experienced by the tuning portion of the oscillator at the time of the carrier fade-out. The employment of motors in automatic frequency control systems, however, has proved to have several disadvantages, not the least of which is slowness in time of reaction in the presence of carrier recurrence.

Therefore, it is an object of this invention to provide a new and useful automatic frequency control circuit.

It is a further object of the present invention to provide a new and useful automatic frequency control circuit which will maintain the frequency of an associated oscillator despite signal fade-out.

According to the present invention, an input carrier is fed simultaneously into a discriminator and a biasing circuit. The discriminator has a unique output circuit comprising two series-connected diode-resistor combinations balanced to ground, each combination being shunted by a respective capacitor which has a sole discharge path consisting of its respective diode-resistor combination. The biasing circuit is actuated upon the decrease in energy level of the input carrier below a predetermined threshold value, at which time a bias is applied to the diodes to interrupt the discharge path of the capacitors. Consequently, the capacitors will retain their charge until the carrier reappears, at which time the bias is removed from the diodes. The capacitors are coupled to the input of a balanced reactance modulator; thus, the reactance modulator will maintain the frequency of an associated oscillator at that point at which carrier fade-out occurs, until the carrier reappears to resume control over the AFC circuit.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
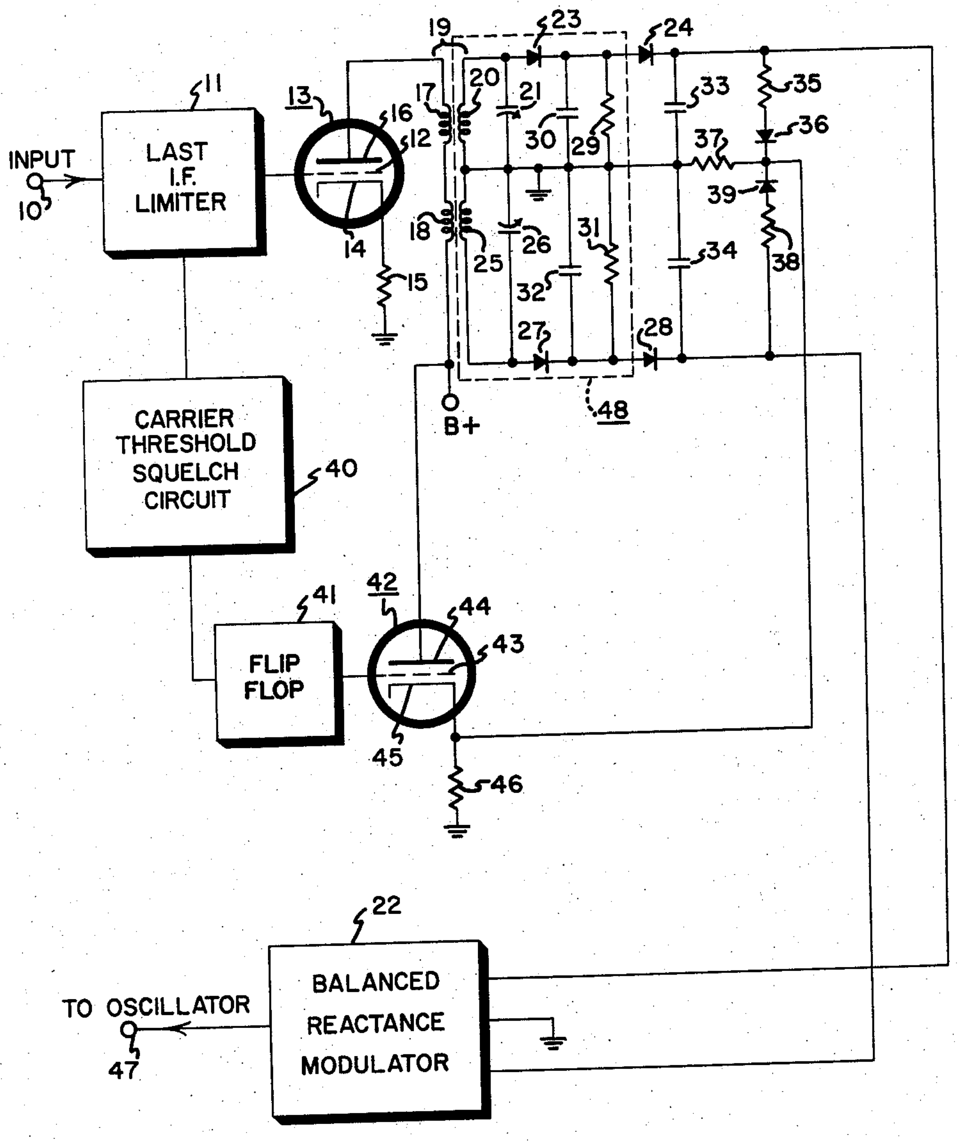
Figure 1 is a schematic diagram, partly in block form, of a first embodiment of an automatic frequency control circuit, according to the present invention.

Figure 1 illustrates the AFC circuit of an F. M. receiver. It will be understood, of course, that the invention and the discussion thereof will apply equally well in any system in which the AFC circuit is employed, for example, F. M. transmitter, A. M. receivers and transmitters, microwave radar receivers and transmitters, etc. In Figure 1, then, is shown an input terminal 10 to which the F. M. carrier and side bands will be applied. Input terminal 10 is coupled through the last I. F. limiter stage 11 to control electrode 12 of limiter isolation tube 13. Cathode 14 of vacuum tube 13 is coupled through cathode resistor 15 to ground. Anode 16 is coupled through primary windings 17 and 18 of transformer 19 to a source of positive potential (B+). The parallel resonant circuit comprising secondary winding 20 and tunable capacitor 21 is coupled between ground and a first input circuit of balanced reactance modulator 22, through diodes 23 and 24. The parallel resonant circuit comprising secondary winding 25 and capacitor 26 is connected between ground and a second input circuit of balanced reactance modulator 22, through diodes 27 and 28. Capacitors 21 and 26 are adjustable to provide for the alignment of the respective stagger-tuned circuits. Resistor 29 and capacitor 30 are coupled in parallel between ground and the junction of diodes 23 and 24. Resistor 31 and capacitor 32 are coupled in parallel between ground and the junction of diodes 27 and 28. Capacitors 33 and 34 are coupled between ground and the emitter side of diodes 24 and 28, respectively. The emitter side of diode 24 is also coupled to ground through resistor 35, diode 36, and resistor 37, in that order. The emitter side of diode 28 is coupled to ground through resistor 38, diode 39, and resistor 37, in that order.

Carrier threshold squelch circuit 40, flip-flop circuit 41, vacuum tube 42, and resistor 37 comprise a biasing circuit for diodes 36 and 39. The carrier output from limiter 11 is fed through carrier threshold squelch circuit 40 and through flip-flop circuit 41 to control electrode 43 of vacuum tube 42. Anode 44 of vacuum tube 42 is connected to a source of positive potential (B+). Cathode 45 of vacuum tube 42 coupled to ground through cathode load resistor 46. The junction of cathode load resistor 46 and cathode 45 is directly connected to the junction of diodes 36 and 39 and resistor 37. The output of balanced reactance modulator 22 is coupled to output terminal 47 which is in turn adapted for coupling to the associated local oscillator.

The circuit shown in Figure 1 operates as follows. The circuit included within dotted line 48 is a conventional balanced, stagger-tuned discriminator circuit and requires no further explanation. Of course, any type of discriminator circuit balanced to ground may be employed. The tube stage including vacuum tube 13 is merely a buffer stage which isolates electrically the discriminator portion of the circuit from the last I. F. limiter of the receiver. The input F. M. carrier and side bands are coupled through limiter 11 and through isolation tube 13 to transformer 19 which inductively couples the input signal to discriminator 48. Diodes 24 and 28 prevent capacitors 33 and 34, respectively, from discharging through resistors 29 and 31, respectively. The sole discharge path of capacitor 33 is through resistor 35, diode 36, and resistor 37, in that order. The sole discharge path for capacitor 34 is through resistor 38, diode 39, and resistor 37. When the energy level of the carrier falls below a predetermined threshold value, squelch circuit 40 operates flip-flop circuit 41 so that vacuum tube 42 will begin to conduct. (Vacuum tube 42 is normally non-conducting.) When vacuum tube 42 draws current, a bias potential develops across cathode resistor 46 which causes current to flow through resistor 37. The bias voltage developed by resistor 37 effectively cuts off diodes 36 and 39, that is to say, the signal voltage developed across capacitors 33 and 34 plus the contact potentials of the respective diodes will always be less than the positive bias voltage developed across resistor 37. Thus, when the carrier falls below a predetermined threshold value, diodes 36 and 39 will be biased off so that capacitors 33 and 34 will hold their charge and thus continue to impress their respective voltages upon the input circuit of balanced modulator 22. It becomes apparent that the back resistance of diodes 24 and 28 must be high, necessarily. Hence, the electrical condition of balanced reactance modulator 22 will remain substantially the same throughout the carrier fade-out interval as the condition which the modulator experienced at the instant of carrier fade-out. The oscillator frequency, hence, will remain unchanged throughout the fade-out interval. The moment the energy level of the input carrier rises above threshold value, flip-flop circuit 41 will immediately return vacuum tube 42 to its non-conductive state, and hence the diode bias will be removed and thus enable normal discriminator operation.

Figure 2:
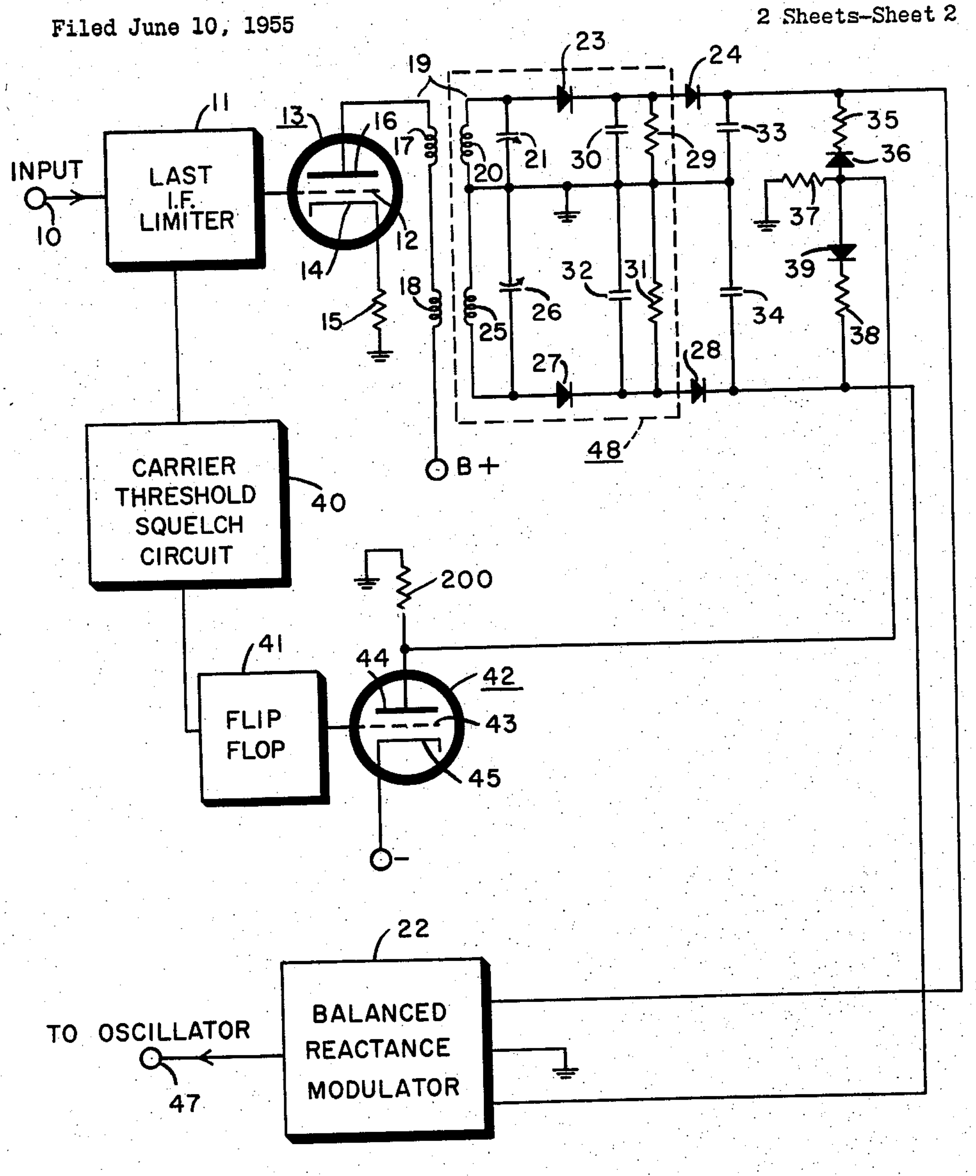
Figure 2 is a schematic diagram, partly in block form, of a second embodiment of an automatic frequency control circuit, according to the present invention.

The circuit of Figure 2 is identical with that of Figure 1 except that the polarity of diodes 36 and 39 is reversed and the polarity of the bias voltage developed by vacuum tube 42 is shown reversed (since anode 44 is coupled through resistor 200 to ground and cathode 45 is maintained at a highly negative potential). In the case of Figure 2, the voltage developed across resistor 37 will be negative in order to accomplish the appropriate biasing of diodes 36 and 39. Otherwise, the operation of the circuit in Figure 2 is exactly the same as that in Figure 1.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In combination, an input circuit adapted for coupling to a signal source, a discriminator coupled to said input circuit and having an output circuit, said discriminator output circuit including at least one capacitor, a series-connected resistor and diode combination shunting said capacitor and providing a discharge path for said capacitor, bias means coupled to said input circuit and responsive to reductions in energy level below a predetermined threshold of an input signal frequency therefrom and connected to said resistor and diode combination for biasing and thereby rendering non-conductive said diode for durations of decreased energy levels of said signal, said capacitor being adapted for coupling to a frequency control circuit.

2. In combination, an input circuit adapted for coupling to a signal source, a discriminator coupled to said input circuit and having an output circuit, said discriminator output circuit including at least one capacitor, a series-connected resistor and diode combination shunting said capacitor, said capacitor being adapted for coupling to a frequency control circuit, and bias means coupled to said input circuit and responsive to reductions in energy level below a predetermined threshold of an input signal frequency therefrom for biasing and thereby rendering non-conductive said diode for durations of decreased energy levels of said signal, said bias means comprising a squelch circuit, a flip-flop circuit coupled to said squelch circuit, and means coupled to said flip-flop circuit and responsive to signals therefrom for generating a bias voltage during intervals of decreased energy level of said input signal.

3. Apparatus according to claim 2 in which said bias generating means comprises a cathode follower.

4. Apparatus according to claim 2 in which said bias generating means comprises a vacuum tube having a control element coupled to said flip-flop circuit, an anode, a cathode maintained at a negative potential, and a load resistor coupled between said anode and a common reference potential which is positive with respect to said negative potential.

5. Apparatus according to claim 3 in which said discriminator comprises a stagger-tuned discriminator balanced to ground and having first and second output resistors each having a first terminal maintained at reference potential and a second terminal; a first diode having a collector terminal coupled to said second terminal of said first resistor and an emitter terminal; a first capacitor coupled between said emitter terminal of said first diode and said reference potential; a second diode having a collector terminal coupled to said second terminal of said second resistor and an emitter terminal; a second capacitor coupled between said emitter terminal of said second diode and said reference potential; a third resistor having a first terminal maintained at said reference potential and a second terminal; third and fourth diodes each having an emitter terminal connected to said second terminal of said third resistor and a collector terminal; a fourth resistor having a first terminal connected to said collector terminal of said third diode and a second terminal connected to the junction of said first capacitor and said first diode; and a fifth resistor having a first terminal connected to said collector terminal of said fourth diode and a second terminal connected to the junction of said second capacitor and said second diode; the junction of said third resistor, said third diode, and said fourth diode being connected to said cathode of said cathode follower.

6. Apparatus according to claim 4 in which said discriminator comprises a stagger-tuned discriminator balanced to ground and having first and second output resistors each having a first terminal maintained at ground potential and a second terminal; a first diode having a collector terminal coupled to said second terminal of said first resistor and an emitter terminal; a first capacitor coupled between said emitter terminal of said first diode and said common reference potential; a second diode having a collector terminal coupled to said second terminal of said second resistor and an emitter terminal; a second capacitor coupled between said emitter terminal of said second diode and said reference potential; a third resistor having a first terminal maintained at said reference potential and a second terminal; third and fourth diodes each having a collector terminal connected to said second terminal of said third resistor and an emitter terminal; a fourth resistor having a first terminal connected to said emitter terminal of said third diode and a second terminal connected to the junction of said first capacitor and said first diode; and a fifth resistor having a first terminal connected to said emitter terminal of said fourth diode and a second terminal connected to the junction of said second capacitor and said second diode; the junction of said third resistor, said third diode, and said fourth diode being connected to said anode of said vacuum tube.

References Cited in the file of this patent

UNITED STATES PATENTS

| | | |
|---|---|---|
| 2,123,716 | Crosby | July 12, 1938 |
| 2,129,085 | Foster | Sept. 6, 1938 |
| 2,172,456 | Schock | Sept. 12, 1938 |
| 2,483,315 | DeGroot | Sept. 27, 1949 |
| 2,501,883 | Weaver | Mar. 28, 1950 |
| 2,567,286 | Hugenholtz | Sept. 11, 1951 |
| 2,685,039 | Scarbrough | July 27, 1954 |